United States Patent [19]

Coburn

[11] Patent Number: 4,593,254
[45] Date of Patent: Jun. 3, 1986

[54] VCO CENTERING CIRCUIT

[75] Inventor: Ronald L. Coburn, Fuquay-Varina, N.C.

[73] Assignee: International Business Machines Corp., Armonk, N.Y.

[21] Appl. No.: 681,767

[22] Filed: Dec. 14, 1984

[51] Int. Cl.$^4$ .............................................. H03L 7/08
[52] U.S. Cl. ...................................... 331/1 A; 331/17
[58] Field of Search .................. 331/1 A, 1 R, 17, 18, 331/25

[56] References Cited

U.S. PATENT DOCUMENTS 3,965,438  6/1976  Winston ............................... 331/1 A
4,456,890  6/1984  Carickhoff ........................... 331/1 A Primary Examiner—Gene Wan
Attorney, Agent, or Firm—Joscelyn G. Cockburn

[57] ABSTRACT

A circuit arrangement for recovering data from a communications network includes a phase lock loop (PLL) with a voltage controlled oscillator (VCO) and a circuit for automatically centering the VCO. The circuit arrangement includes a counter that stores a changeable digital word. The digital word provides an adjustable current for driving the VCO. Initially, the VCO is driven so that its output signal falls within a predetermined frequency range. An error voltage representing the difference between a predetermined voltage range is developed and is used to change the contents of the counter until the VCO is centered. Thereafter the count that causes centering of the VCO is locked in the counter and normal PLL function is enabled.

8 Claims, 2 Drawing Figures

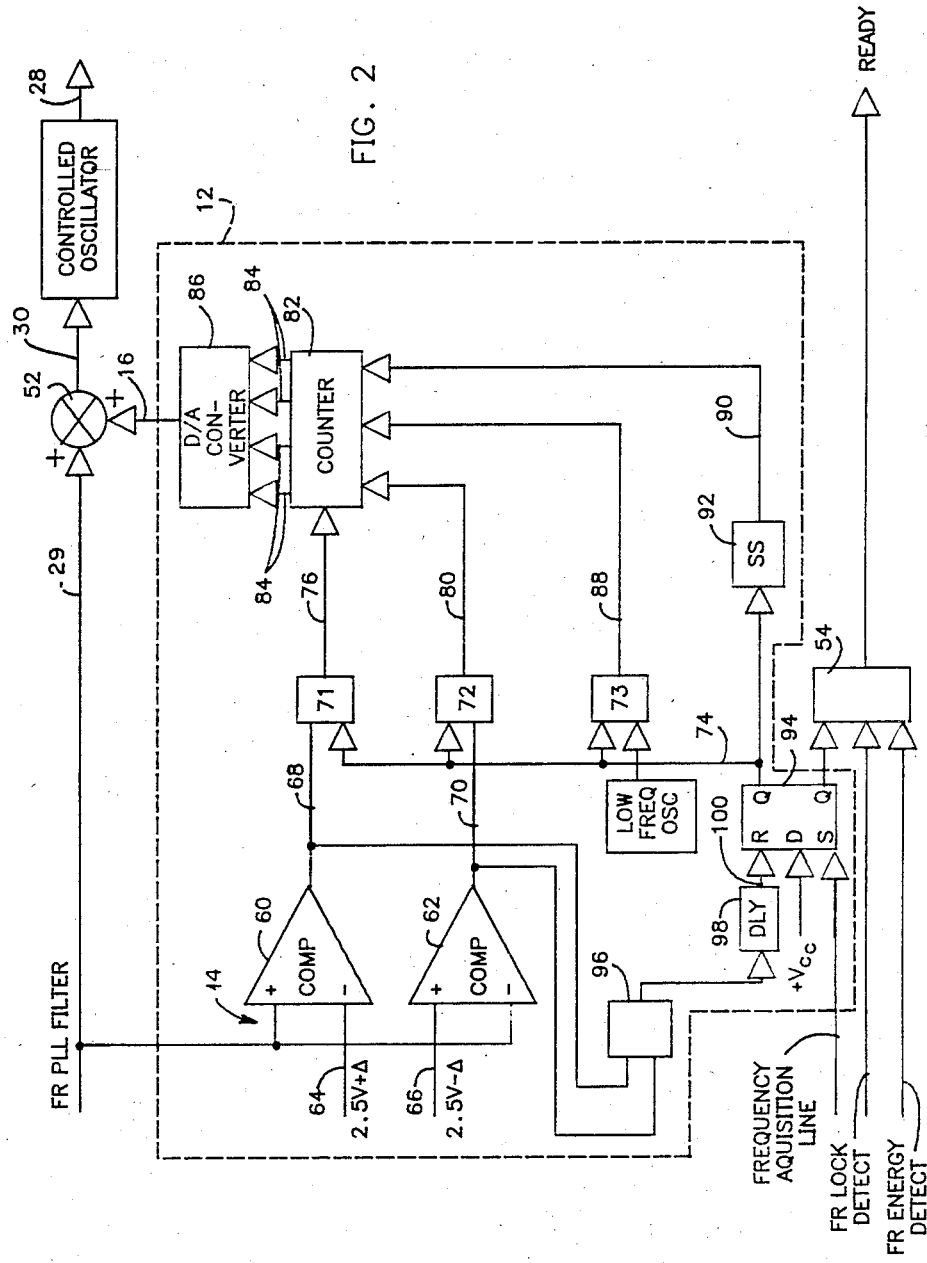

VCO CENTERING CIRCUIT

BACKGROUND OF THE INVENTION

1. Field of the Invention

The invention relates to phase lock loops in general and more particularly to apparatus for centering the Voltage Control Oscillator (VCO).

2. Prior Art

The use of phase lock loops in various types of communication systems is well known in the prior art. A typical phase lock loop consists of a phase comparator, a loop filter and a voltage controlled oscillator (VCO). The phase comparator compares the phase of an input reference signal with the phase of the VCO and generates an error voltage which is used to drive the VCO until it is phase locked with the input reference signal. It is desirable to have as large a dynamic range of correction voltage as possible. This would allow the maximum correction for phase transients and frequency variations in the reference signal.

In integrated circuit technology, design of VCO circuits usually has a variation in the natural frequency ($f_c$) of ±8%. In addition, the timing capacitor which is an integral part of the VCO usually has a tolerance of ±5%. As a result, the VCO natural frequency will vary by ±13%. The variation means that as the PLL locks onto an input signal, at a particular frequency, the VCO will be forced to that frequency by an adjustment in the correction voltage at its input. This consumes a large part of the available voltage range and limits the dynamic range of the PLL for tracking phase and/or frequency changes in the incoming signal.

In the past using up a large part of the available voltage range presents no problems since linear circuits were designed using voltages with a potential difference of at least 10 volts. In cases where the optimum range was required, a potentiometer was used to adjust the VCO to the desired frequency when the input voltage was at the center of the allowed range.

There are several technologies in which the range of voltages available for adjusting the VCO is relatively narrow. For example, in a VLSI chip a potential difference of 4.5 volts or less is available. In addition, there is an effort in the CMOS technology to design chips comprising of logic circuits, processors and memories. It is believed that these designs will probably have a larger variation in the natural frequency ($f_c$) of the VCO. In fact, it is believed that as the integration and/or compaction of devices on a single chip increase, the variation in the natural frequency of the VCO will also increase. The use of a potentiometer to manually set the center frequency is very undesirable. With the variation in the natural frequency of the VCO and the limited range for the correction voltage, it is obvious that some efficient method is needed to adjust the center frequency of the VCO.

SUMMARY OF THE INVENTION

It is therefore the general object of the present invention to provide a more efficient PLL apparatus than was heretofore possible.

It is still another object of the present invention to provide a PLL with a device and method for automatically adjusting the $f_c$ (center frequency) of the VCO.

At the start of an adjustment cycle the VCO in the PLL is forced to operate at the frequency of a local crystal. Preferably, the frequency is equivalent to the nominal frequency of the input signal. An error voltage is developed and is compared to the voltage available for adjusting the VCO. Preferably, the voltage should be at the midpoint of the adjustment range. If the error voltage falls outside of an allowable range, a counter means is activated and provides a bias current which drives the VCO. The process of forcing the VCO to the crystal frequency and comparing the correction or error voltage is repeated until the compare means finds that the VCO correction voltage falls within the allowable range whereupon the proper bias current is locked into the counter means.

In one feature of the invention, means is provided for issuing a signal indicating that the adjustment is complete and the normal PLL function is enabled.

BRIEF DESCRIPTION OF THE DRAWINGS

FIG. 2 shows the details of a circuit for adjusting the center frequency of the PLL.

DETAILED DESCRIPTION OF THE PREFERRED EMBODIMENT

Figure 1:
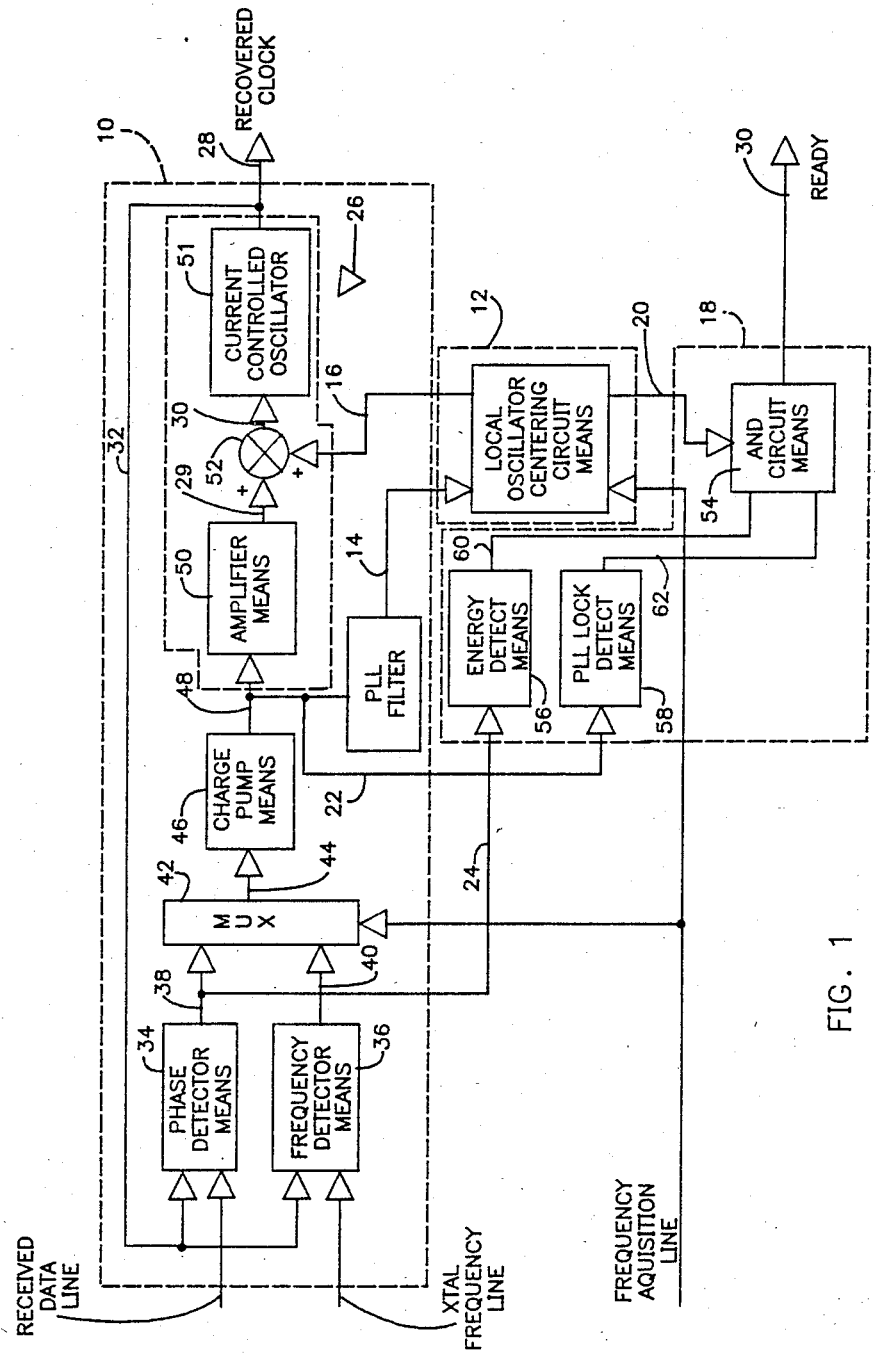
FIG. 1 shows a block diagram of an improved PLL according to the teachings of the present invention.

FIG. 1 shows a block diagram of a circuit arrangement embodying the teaching of the present invention. The circuit arrangement comprises of a phase locked loop identified by numeral 10, a local oscillator centering circuit means 12 connected by conductors 14 and 16, respectively, to the phase locked loop and a signal indicating means 18 connected by conductors 20, 22, and 24, respectively, to the phase locked loop and the local oscillator centering circuit means 12. The phase locked loop 10 receives data on the received data line and adjusts the frequency of current control oscillator 51 until the phase of the output signal from the current control oscillator locks onto the phase of the incoming data signal. Thereafter, a signal labeled recovered clock is outputted on conductor 28. The local oscillator centering circuit means 12, when activated by a control signal on the line identified as frequency acquisition line, initiates a series of adjustment routines until a suitable bisync current is outputted on conductor 16. The bisync current is sufficient to drive the current control oscillator so that the output frequency is positioned at the free-running frequency of the oscillator. Although obvious to those skilled in the art, it should be noted that current controlled oscillator 51, amplifier means 50 and summing means 52 may be identified as VCO 26.

Thereafter, the signal indicating means 18 monitors the condition on the phase locked loop and whenever the centering routine is completed outputs a ready signal on conductor 30. Thereafter, the phase locked loop is enabled to run in its normal operating condition. The adjustment routine which is provided by local oscillator centering circuit means 12 allows the full range of the available voltage to be used in adjusting the current control oscillator to lock onto the incoming data and as a result improves the operational characteristics of the phase lock loop.

Still referring to FIG. 1, the phase lock loop 10 comprises a current controlled oscillator 51 having conductor 28 connected to its output terminal and conductor 30 connected to its input terminal. A feedback conductor identified by numeral 32 connects the output terminal of the current controlled oscillator to one of the inputs on phase detector means 34 and frequency detector means 36. In particular, the phase detector means 34 accepts the feedback signal from the current controlled oscillator and compares it with input data signal on the received data line. Whenever there is a phase difference between the signals, the phase detector means outputs a voltage signal on conductor 38.

Likewise, frequency detector means 36 accepts the feedback signal from current controlled oscillator 51, compares it with a control signal on the crystal (xtal) frequency line and whenever there is a difference in the frequency outputs a signal on conductor 40. The signals on conductor 38 and 40 are fed into multiplexor (MUX) means 42. The multiplexor means 42 is a conventional off-the-shelf multiplexing device and as such the details will not be given. The multiplexing means 42 is controlled by a series of control pulses outputted on the frequency acquisition line. Depending on the signal on the frequency acquisition line, the multiplexing means 42 is cause to select the output of either the phase detector means 34 or the output of the frequency detector means 36. The signal which is selected is fed over conductor 44 into charge pump means 46. The charge pump means 46 is a conventional off-the-shelf device and the details will not be given. Output signals from the charge pump means 46 are fed over conductor 48 into amplifier means 50. The amplifier means 50 accepts a signal from conductor 48, amplifies the signal and drives the signal into summing means 52 from whence it adjusts the current into the current controlled oscillator, thereby forcing the oscillator into lock with incoming signals.

Still referring to FIG. 1, signal indicating means 18 comprises AND circuit means 54 which is connected to energy detection means 56 and phase lock loop (PLL) detecting means 58 over conductors 60 and 62, respectively. Energy detection means 56 is connected over conductor 24 to phase detector 34. The energy detection 56 monitors the output of phase detector means 34 and outputs a signal on terminal 60 when energy is outputted from the phase detector means. Similarly, phase lock loop lock detection means 58 is connected by conductor 22 to the output of charge pump means 46. The function of the phase lock loop lock detection means 58 is to indicate, by means of outputting a signal on terminal 62, when the loop is not locked. The signals on conductors 60 and 62 are combined in AND circuit means 54 to generate a ready signal on conductor 30.

FIG. 2 shows the details of the local oscillator centering circuit means 12. In order to simplify the description, common numerals are used to identify elements which are common to both FIGS. 1 and 2. The local oscillator centering circuit means 12 comprises of a pair of comparators identified by numerals 60 and 62. The comparators are used to set a voltage reference window within which the phase locked loop filter voltage on conductor 14 must be positioned when the frequency of the output signal, from the controlled oscillator, is positioned at its center frequency. As will be explained subsequently, once the phase locked loop filter voltage is positioned within this window, the bias voltage which provides the current on conductor 16 is locked into place and thereafter the loop is energized for normal operation. In the preferred embodiment of this invention the voltage available for driving the controlled oscillator is approximately 5 V distributed on both the positive and the negative directions relative to a 0 voltage reference line. With this distribution comparator 60 which sets the upper limit of the window is supplied with a 2.5 V+$\Delta$ on conductor 64. Similarly, comparator 62 sets the lower limit of the window and is supplied with a voltage value 2.5 V−$\Delta$ on conductor 66. It should be noted that the comparators may be used to set a voltage window other than 5 V. Therefore, the use of 5 V as a desirable voltage window is only representative of a particular voltage range and ought not to be construed as a limitation of the scope of the present invention.

The output signals from comparators 60 and 62 are fed over conductors 68 and 70, respectively, into AND blocks 71 and 72. With the aid of a control signal on conductor 74 (to be described later) AND blocks 71 and 72 generate the increment counter pulses on conductor 76 and the decrement counter pulses on conductor 80. The increment/decrement pulses are fed into counter 82. As will be explained subsequently, counter 82 is used as a variable register to hold a digital word corresponding to the bias current which is used to center the control oscillator. The output from counter 82 is fed over conductors 84 into digital to analog (D/A) converter 86. The D/A converter converts the digital words stored in the counter to a corresponding bias current which is fed over conductor 16 into summing means 52.

Still referring to FIG. 2, a clock pulse and a reset pulse are generated and applied to counter 82 on conductors 88 and 90, respectively. The clock pulse is used for stepping the counter and is generated from AND block 73. The input into AND block 73 is from a low frequency oscillator and a controlled signal (to be described later) generated on conductor 74. Likewise, the reset pulse on conductor 90 is enabled to reset the counter at the beginning of an adjustment cycle and is generated from single shot (SS) circuit 92. The single shot circuit is activated by the control signals on conductor 74. The control signal on conductor 74 is generated from the Q output of a D type latch identified by numeral 94. The latch is the primary controller for the centering circuit 12. To this end, the latch detects whenever the input signal "frequency acquisition" mode is selected. This selection is indicated by placing a control pulse on the frequency acquisition line. The pulse sets the counter and starts a new bias adjustment cycle to center the local oscillator. The latch is reset with a pulse generated from OR circuit block 96. The OR block detects when both comparators are indicating that the phase lock loop correction voltage is within the desired window. The pulse is delayed by delay block 98 from whence it is fed over conductor 100 into the reset terminal of the latch. A supply voltage +$V_{cc}$ is provided on the data (D) terminal of the latch.

Operation

The circuit arrangement operates as follows:

When the signal on the frequency acquisition line (FIG. 2) goes from the low "phase detector" mode to the high "frequency detector" mode, latch 94 is triggered. The data (D) input is tied to +VCC so that the Q output goes high. This enables the increment/decrement gates 71 and 72, respectively, and the clock gate 73. Also, the single shot 92 is triggered causing the counter to preset to its mid-range. The D/A converter establishes a DC bias current on conductor 16 which is summed with the current on conductor 29. The current on conductor 29 is obtained from the amplifier stage of the phase lock loop. The phase lock loop in frequency acquisition mode will drive the voltage on the filter until the crystal frequency is acquired. If the voltage filter is not within the window set by 2.5 V+Δ or 2.5V−Δ then either the increment or decrement gate is enabled. This drives the counter in the direction to achieve 2.5 V when the VCO is at the crystal frequency.

Similarly, the low frequency oscillator is at a frequency low enough to allow frequency acquisition at each new DC bias current, thus after each clock pulse the system will settle at the crystal frequency. The phase lock filter voltage will be compared to the window and additional steps will be taken until the window voltage is reached. At this time the latch will be reset so that the Q output is low, holding the counter at the value that gives proper bias current towards either window voltage and the phase locked filter. The $\overline{Q}$ output enables one leg of the AND circuit 54. When the lock and energy detect circuits are satisfied, a ready signal is forwarded to the system. The VCO natural frequency has now been adjusted to the desired frequency with its input voltage at the mid-range point.

The described circuit arrangement eliminates the deviation from the middle of the VCO input range and allows lower gain VCO circuits. Another benefit is that the above-described system can be integrated into an LSI chip design and does not require any more card space. In addition, the available signal range is expanded by a factor of 4 or 5.

Although the invention has been particularly shown and described with reference to a preferred embodiment thereof, it will be understood by those skilled in the art that various changes in form and details may be made therein without departing from the spirit and scope of the invention.

Having thus described my invention, what I claim as new and desire to secure as Letters Patent is as follows:

1. A circuit arrangement for automatically biasing a VCO so that an output frequency $f_o$ is being positioned at the center frequency $f_c$ of the VCO, said circuit arrangement comprising:
   a counting means operable for storing a digital count and for providing an adjustable signal for driving the VCO until the output frequency $f_o$ is being positioned at the center frequency $f_c$;
   first means operable for monitoring an output signal from the VCO and for generating an error signal with said error signal operable for adjusting the digital count if said output signal falls outside of a predetermined signal range; and
   clock means operable for stepping the counting means.

2. In a phase lock loop circuit arrangement having a voltage control oscillator with a center operating frequency $f_c$ and output frequency $f_o$, a reference means that provides a reference frequency $f_r$, a phase comparator means connected to the reference means and the voltage control oscillator and operable for providing an error signal representative of the difference between $f_r$ and $f_o$, the improvement comprising:
   a D/A converter means coupled to the VCO;
   a counting means connected to the D/A converter means and operable for storing a count representative of a biasing signal being needed for driving the VCO so that the output frequency $f_o = f_c$;
   a first means for presetting the counting means;
   a second means for incrementing the counting means;
   a third means for decrementing the counting means;
   means operable for setting a predetermined voltage range within which an output voltage from the VCO falls whenever $f_o = f_c$ and for comparing the output voltage with the predetermined voltage range and to apply error signals to the second and third means if the output voltage falls outside of the predetermined voltage range; and
   control means operable for providing control signals for enabling the first, second and third means.

3. An improved phase lock loop circuit arrangement comprising:
   an oscillator means having an input terminal and an output terminal;
   a phase detector means coupled to the output terminal;
   a frequency detector means coupled to said output terminal;
   a multiplexor means coupled to the frequency detector means and the phase detector means;
   a charge pump means coupled to the multiplexor;
   an amplifier means coupled to the charge pump;
   a D/A converter coupled to the oscillator means, a counting means being coupled to the converter;
   first means being coupled to the counting means and operable to determine the range over which the counting means is active;
   clock means operable for stepping the counting means;
   second means operable for controlling the counting means;
   a summing means operable for summing electrical signals outputted from the D/A converter and the amplifier means to form a single signal for driving the oscillator means; and
   an enabling signal means operable for periodically enabling the multiplexor means to allow the passing of signals from the frequency detector means only and for periodically enabling the counting means to adjust its output signal until the frequency of the oscillator means falls within a predetermined range.

4. The phase lock loop of claim 3 wherein the first means includes a pair of comparator means one of which being operable to define the top limit of the range and the other being operable to define the bottom limit of the range and a pair of "AND" circuits one of each being coupled to an output from the comparator means; said "AND" circuits being operable to combine the signals generated from the comparators with a control signal to provide signals indicating the direction for stepping the counter.

5. The phase lock loop of claim 3 wherein the clock means includes a low frequency oscillator; and
   an "AND" circuit connected to the low frequency oscillator.

6. The phase lock loop of claim 3 wherein the second means includes a latch means; and
   a single shot circuit connected to the latch means.

7. In a phase lock loop circuit arrangement having a voltage control oscillator with a center operating frequency $f_c$ and output frequency $f_o$, reference means that provides a reference frequency $f_r$, a phase comparator means connected to the reference means and the voltage controlled oscillator and operable for providing an error signal representative of the differences between $f_r$ and $f_o$, a method for biasing the VCO so that $f_o = f_c$ comprising the steps of:
   (a) providing a local crystal oscillator for periodically outputting a relatively low frequency signal;

(b) providing a biasing means being responsive to the low frequency signal and containing a count for periodically suppling a biasing current to the VCO;
(c) providing a reference window representative of a voltage range available for driving the VCO;
(d) energizing the VCO with the biasing current;
(e) monitoring the output signal from the VCO;
(f) comparing the output signal with the reference window;
(g) adjusting the bias current if the signal falls outside of the reference window; and
(h) repeating steps (d)–(h) until the output signal falls within the reference window.

8. The method of claim 7 further including the steps of locking the biasing means with the count that causes the output signal to fall within the predetermined range; and providing a signal indicating that the adjustment is completed.

* * * * *